(12) United States Patent
Quinn et al.

(10) Patent No.: US 10,170,701 B2
(45) Date of Patent: Jan. 1, 2019

(54) CONTROLLED DEPOSITION OF MATERIALS USING A DIFFERENTIAL PRESSURE REGIME

(71) Applicant: Universal Display Corporation, Ewing, NJ (US)

(72) Inventors: William E. Quinn, Whitehouse Station, NJ (US); Siddharth Harikrishna Mohan, Plainsboro, NJ (US); Gregory McGraw, Yardley, PA (US); Xin Xu, West Windsor, NJ (US)

(73) Assignee: Universal Display Corporation, Ewing, NJ (US)

( * ) Notice: Subject to any disclaimer, the term of this patent is extended or adjusted under 35 U.S.C. 154(b) by 20 days.

(21) Appl. No.: 15/449,946

(22) Filed: Mar. 4, 2017

(65) Prior Publication Data

US 2017/0256714 A1  Sep. 7, 2017

Related U.S. Application Data

(60) Provisional application No. 62/303,458, filed on Mar. 4, 2016.

(51) Int. Cl.
| | |
|---|---|
| *H01L 21/31* | (2006.01) |
| *H01L 51/00* | (2006.01) |
| *C23C 14/24* | (2006.01) |
| *C23C 14/12* | (2006.01) |
| *C23C 14/04* | (2006.01) |

(52) U.S. Cl.
CPC ........ *H01L 51/0013* (2013.01); *C23C 14/042* (2013.01); *C23C 14/12* (2013.01); *C23C 14/24* (2013.01)

(58) Field of Classification Search
CPC ............. H01L 51/0013; H01L 21/6838; H01L 21/68735; C23C 14/042; C23C 14/12; C23C 14/24; C23C 16/45544; C23C 16/46; C23C 16/50; C23C 16/458
USPC .......... 438/99, 758, 762, 790, 791; 118/715, 118/723 DC
See application file for complete search history.

(56) References Cited

U.S. PATENT DOCUMENTS

| | | | |
|---|---|---|---|
| 4,769,292 | A | 9/1988 | Tang et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |

(Continued)

FOREIGN PATENT DOCUMENTS

| | | |
|---|---|---|
| WO | WO-2008057394 A1 | 5/2008 |
| WO | WO-2010011390 A2 | 1/2010 |

OTHER PUBLICATIONS

Baldo, et al., "Highly efficient phosphorescent emission from organic electroluminescent devices", Nature, vol. 395, pp. 151-154, 1998.

(Continued)

*Primary Examiner* — Brook Kebede
(74) *Attorney, Agent, or Firm* — Morris & Kamlay LLP

(57) ABSTRACT

Methods and devices for controlling pressures in microenvironments between a deposition apparatus and a substrate are provided. Each microenvironment is associated with an aperture of the deposition apparatus which can allow for control of the microenvironment.

9 Claims, 3 Drawing Sheets

(56) References Cited

U.S. PATENT DOCUMENTS

| | | | |
|---|---|---|---|
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 7,279,704 | B2 | 10/2007 | Walters et al. |
| 7,404,862 | B2 | 7/2008 | Shtein et al. |
| 7,431,968 | B1 | 10/2008 | Shtein et al. |
| 7,744,957 | B2 | 6/2010 | Forrest et al. |
| 7,879,410 | B2 | 2/2011 | Che et al. |
| 7,897,210 | B2 | 3/2011 | Shtein et al. |
| 7,968,146 | B2 | 6/2011 | Wagner et al. |
| 8,293,329 | B2 | 10/2012 | Forrest |
| 8,613,496 | B2 | 12/2013 | Forrest et al. |
| 8,728,858 | B2 | 5/2014 | Mohan et al. |
| 8,851,597 | B2 | 10/2014 | Forrset |
| 8,944,309 | B2 | 2/2015 | Forrest et al. |
| 2003/0230980 | A1 | 12/2003 | Forrest et al. |
| 2004/0040502 | A1* | 3/2004 | Basceri ............ C23C 16/45514 118/715 |
| 2004/0174116 | A1 | 9/2004 | Lu et al. |
| 2011/0097495 | A1 | 4/2011 | Burrows et al. |
| 2013/0208036 | A1 | 8/2013 | Forrest |
| 2014/0116331 | A1 | 5/2014 | Forrest et al. |
| 2014/0127404 | A1 | 5/2014 | Yudovsky et al. |
| 2014/0138629 | A1 | 5/2014 | Forrest et al. |
| 2014/0220720 | A1 | 8/2014 | Harikrishna Mohan et al. |
| 2015/0376787 | A1 | 12/2015 | McGraw et al. |
| 2015/0380648 | A1 | 12/2015 | McGraw et al. |
| 2016/0020132 | A1* | 1/2016 | Yudovsky ........... H01L 21/6838 438/800 |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

M. S. Arnold et al., "Direct vapor jet printing of three color segment organic light emitting devices for white light illumination," Applied Physics Letters 92, 053301 (2008).

McGraw, "Organic vapor jet printing at micrometer resolution using microfluidic nozzle arrays", Applied Physics Letters 98, 013302 (2011).

S. Biswas et al., Solvent-free, direct printing of organic semiconductors in atmosphere. App. Phys. Lett. 96 263301 (2010).

Shtein, et al., "Direct mask and solvent-free printing of molecular organic semiconductors", Advanced Materials; 16 (18); pp. 1615-1620.

Yun et al., "Digital-Mode Organic Vapor-Jet Printing (D-OVJP): Advanced Jet-on-Demand Control of Organic Thin- Film Deposition", Advanced Materials; 2012; vol. 24; 2857-2862.

\* cited by examiner

CONTROLLED DEPOSITION OF MATERIALS USING A DIFFERENTIAL PRESSURE REGIME

CROSS-REFERENCE TO RELATED APPLICATIONS

This application is a non-provisional of, and claims the benefit of, U.S. Provisional Patent Application Ser. No. 62/303,458, filed Mar. 4, 2016, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to techniques for controlling deposition of materials using differential pressures, such as for deposition of organic light emitting diodes and other devices, including the same, and devices fabricates according to such methods.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

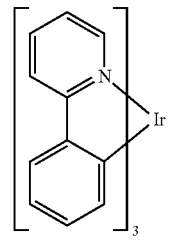

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, a method of depositing a material onto a substrate includes creating a higher pressure regime in a first microenvironment below a first aperture of a deposition device by ejecting, from the first aperture, a delivery gas and a material to be deposited onto a substrate; creating a lower pressure regime in a second microenvironment below a second aperture located adjacent to a first aperture; and creating a higher pressure regime in a microenvironment adjacent to the second aperture. Material may be withdrawn from the second microenvironment by providing a vacuum source by way of the second aperture. A lower pressure regime may be created in the second microenvironment, for example by withdrawing material from the second microenvironment through the second aperture. A higher pressure regime may be created in a third microenvironment below a third aperture, the third aperture disposed adjacent to the second aperture. Similarly, a lower pressure regime may be created in a fourth microenvironment below a fourth aperture that is disposed adjacent to the first aperture and approximately in a line with the second aperture. A higher pressure regime may be created in a fifth microenvironment below a fifth aperture that is disposed adjacent to the fourth aperture. Each lower pressure microenvironment may have a pressure in the range of 75-99% of one or more of the higher pressure microenvironment.

In an embodiment, a deposition device for depositing a material onto a substrate includes a delivery device comprising a first aperture in fluid communication with a delivery gas and a source of organic material to be deposited on a substrate, the first aperture configured to create a higher pressure regime in a first microenvironment below the first aperture; and a second aperture, disposed adjacent to the first aperture, and configured to create a lower pressure regime in a second microenvironment below the second aperture; where the delivery device creates a higher pressure regime in a third microenvironment adjacent to the second aperture. The device may include or be used in conjunction with a vacuum source in fluid communication with the second aperture. A third aperture may be disposed adjacent to the second aperture, which is configured to create a higher pressure regime in a third microenvironment below the third aperture. A fourth aperture may be disposed adjacent to the first aperture and approximately in a line with the second aperture, and configured to create a lower pressure regime in a fourth microenvironment below the fourth aperture. A fifth aperture may be disposed adjacent to the fourth aperture, the fifth aperture configured to create a higher pressure regime in a fifth microenvironment below the fifth aperture.

In an embodiment, a device for deposition of at least one material on a substrate includes a first aperture; a second aperture adjacent to the first aperture; and a source of material to be deposited on a substrate, the source of material being disposed fluid communication with the first aperture, such that when the device is in operation, a higher pressure regime exists in a first microenvironment below the first aperture, a lower pressure regime exists in a second microenvironment below the second aperture, and a higher pressure regime exists in a third microenvironment adjacent to the second microenvironment. The device may include a delivery gas source in fluid communication with the source of material to be deposited with the first aperture. The device may include a delivery gas source in fluid communication with the source of material to be deposited with the first aperture. The device may include a third aperture adjacent to the second aperture, wherein, when the device is in operation, the pressure of the third microenvironment is set via the third aperture.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
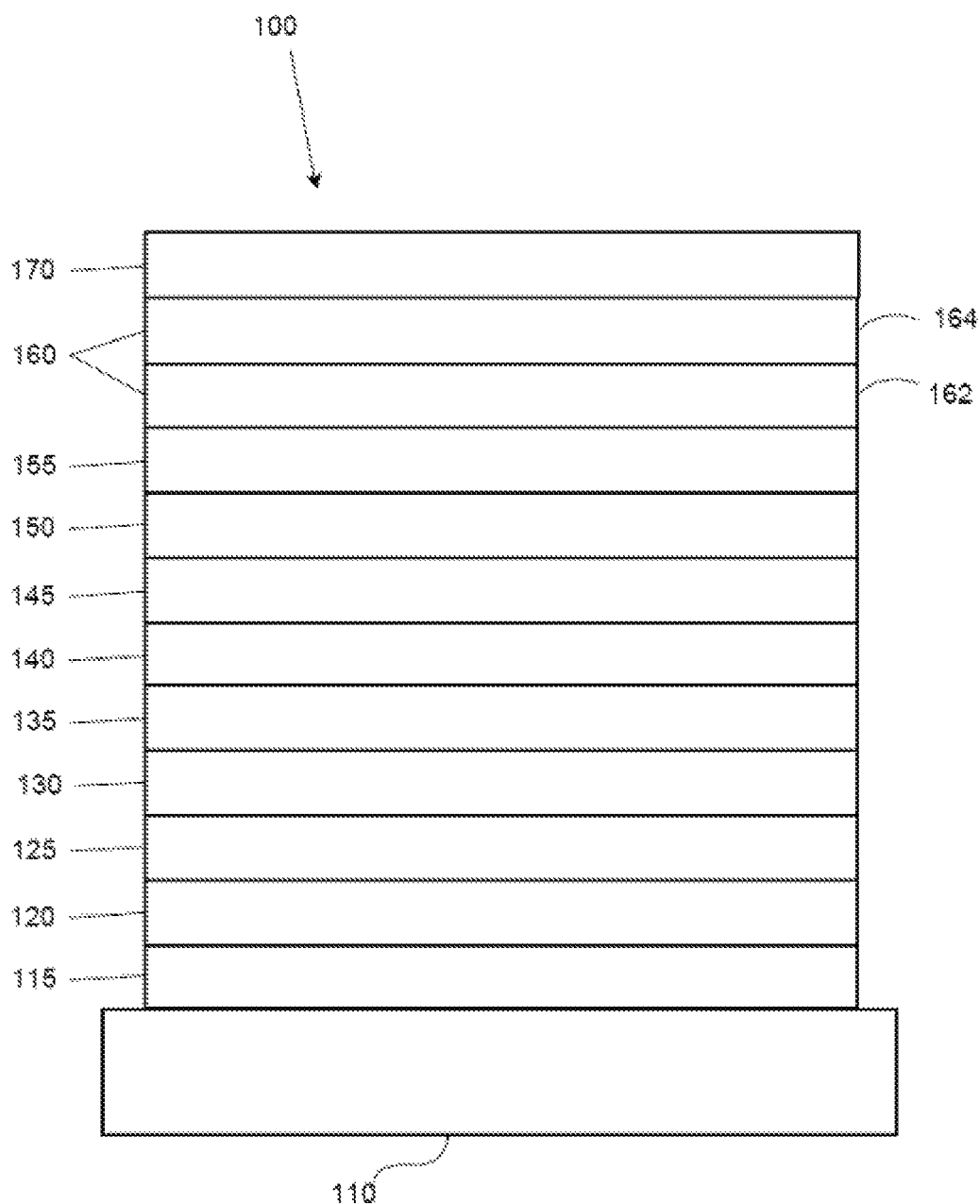
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
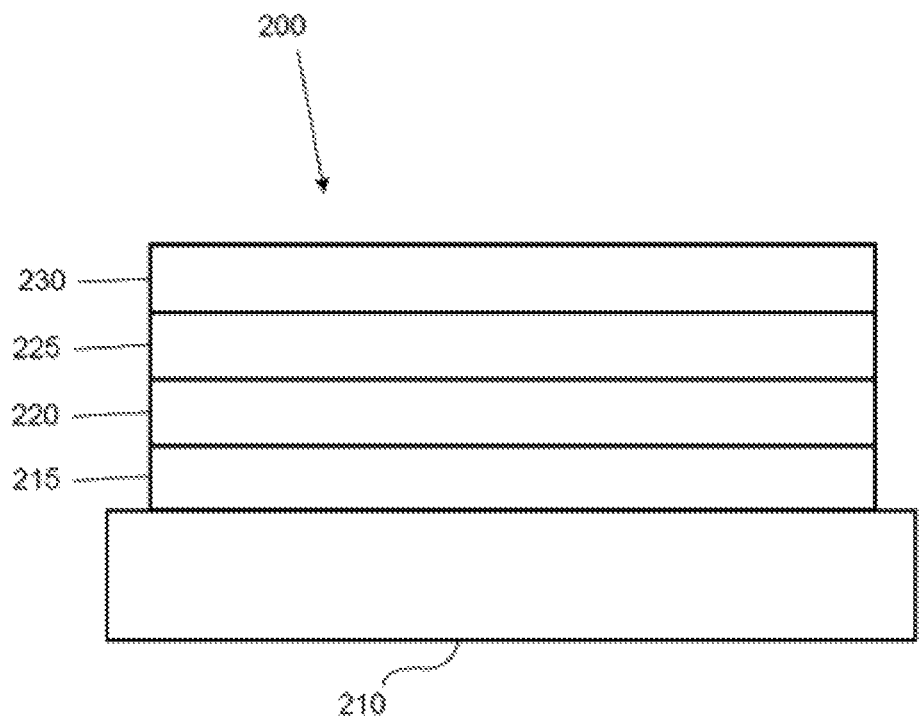
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, virtual reality displays, augmented reality displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to +80 C.

For many deposition techniques, including OVJP and related techniques, it may be desirable to control flow of materials, deposition gases, and other fluids during deposition of materials on a substrate. For example, U.S. application Ser. No. 14/643,887, filed Mar. 10, 2015, Ser. No. 14/730,768, filed Jun. 4, 2015, and Ser. No. 15/290,101, filed Oct. 11, 2016, the disclosure of each of which is incorporated by reference in its entirety, disclose techniques for providing and controlling various gas flows during deposition of organic material on a substrate. These and similar techniques may include, for example, the use of various confining gas flows to limit the region in which the organic material may be deposited.

Embodiments disclosed herein allow for similar control of materials using differential pressure regimes in different microenvironments, such as in the region between a deposition apparatus and a substrate.

As used herein, a "microenvironment" refers to a smaller environment that is partially or completely contained within a larger environment, where the smaller environment has one or more properties different than the larger environment. For example, the region between a nozzle or other deposition aperture and the substrate on which material is to be deposited from the aperture may be considered a microenvironment. In some cases, a microenvironment may be a volume that does not substantially exchange material with surrounding volumes by diffusion. For example, two volumes of gas on either side of an active exhaust aperture would be separate microenvironments, since they would not exchange material via diffusion because any material that normally would move from one to the other via diffusion would be removed by the exhaust. Conditions in separate microenvironments may be identical even though the microenvironments are distinct from one another, such as in this example. In some cases, the smaller environment is defined by one or more limitations. Examples of such properties include, but are not limited to, a different pressure than the larger environment, a different pressure regime than the larger environment, a different physical state than the larger environment, a different temperature than the larger environment, a different molecular makeup than the larger environment. As another example, a deposition apparatus may include multiple adjacent apertures, in which case the region between each aperture and a substrate or, more generally, the region under each aperture, may be considered a separate microenvironment where each region differs in at least one or more properties. In other cases, the region under two or more adjacent apertures may be considered a single microenvironment when there is no difference in properties between regions under adjacent apertures.

As used herein, the terms "high pressure" and "low pressure" refer to relative pressures between two or more environments and/or microenvironments. For example, a second pressure is higher than a first pressure as disclosed herein, if the second pressure is at least the slightest value higher than the first pressure. In embodiments in which there are more than two apertures, the comparative pressures may be stated in reference to the first aperture. For a device having three apertures in which the first aperture has a lower pressure in the microenvironment below the aperture, the second aperture has a higher pressure in the microenvironment below the aperture, and the third aperture has a higher pressure in the microenvironment below the aperture, the pressures below the second and third apertures may be the same, or may be different.

As used herein, an "aperture" refers to an opening in a material or device. As will be understood by the context herein, an aperture can have a shape or size based on the intended use and function of the aperture. A nozzle, such as used for OVJP and similar deposition techniques, may include an aperture at the distal end of the nozzle. Nozzles often are configured so as to eject material through such an aperture at a relatively high velocity. Such configuration may not be required to achieve the effects and benefits disclosed herein.

As used herein, the term "adjacent" indicates that two or more features are proximal to one another. Adjacent apertures may be disposed directly adjacent to one another, i.e., with no intervening apertures or features, such as other features of a deposition device. More generally, two apertures may be adjacent to one another while being adjacent to other features as well, such as one or more other apertures, which may be intervening between the two apertures. For example, when multiple apertures are arranged in a grid or other regular configuration, two interior apertures may be adjacent to one another, while also being surrounded by, and adjacent to, several other apertures.

As used herein, the term "below an aperture" refers to the physical space between an aperture and a substrate. However, it will be understood that the orientation of the device or system may be adjusted so that the substrate exists spatially above the aperture relative to the ambient environment, though the substrate and the intervening physical space may still be described as "below" the aperture herein.

Figure 3:
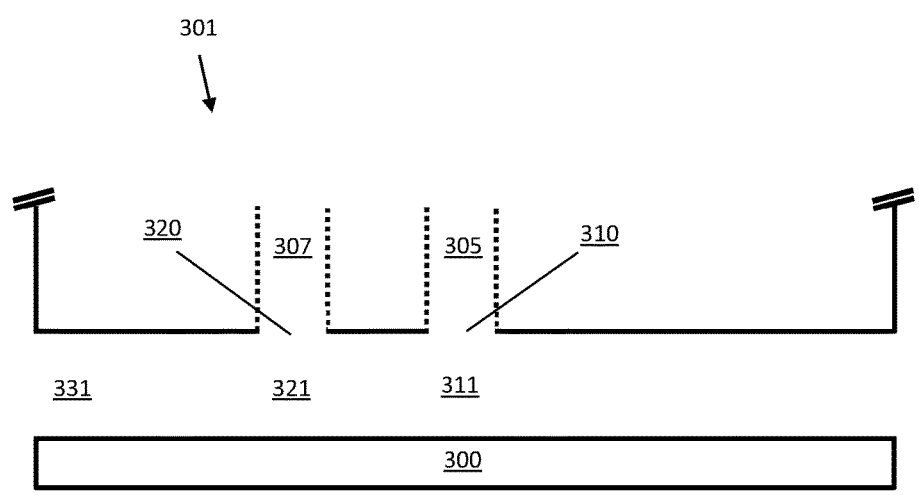
FIG. 3 shows an example schematic representation of an aperture arrangement according to an embodiment.

FIG. 3 shows a cross-section of a device 301 that includes an example of an arrangement according to an embodiment disclosed herein. The arrangement includes first and second apertures 310, 320 disposed adjacent to one another. The first aperture 310 is in fluid communication with a source of material to be deposited on the substrate 300, such as by way of one or more vias 305 that connect to a source within, connected to, or external to the device 301. During operation, i.e., when material is ejected from the first aperture 310 toward a substrate 300, a higher pressure regime exists in the microenvironment 311 below the first aperture 310, while a lower pressure regime exists in the microenvironment 321 below the second aperture 320. The higher pressure regime in the microenvironment 311 typically will be created due to ejection of material, carrier gases, and the like from the aperture 310 during operation. The lower pressure regime in the microenvironment 321 may be created, for example, by the ambient environment, a vacuum source or other active low pressure source, such as a source in fluid communication with the aperture 320 by way of one or more vias 307 or the like, an exhaust or similar arrangement, or any other suitable mechanism. In addition, a higher pressure regime exists in the microenvironment 331 adjacent to the second aperture 320 and/or to the microenvironment 321 below the second aperture. The higher pressure regime in the microenvironment 331 may be created, for example, by pressure ambient, by an active high pressure source, or any other suitable mechanism. The arrangement of a lower pressure microenvironment adjacent to higher pressure microenvironments may create an "inward" flow, i.e., generally in the direction of the microenvironment 311 below the first aperture. This in turn may define the feature size and sharpness of features deposited on the substrate 300 by material ejected from the first aperture 310.

In an embodiment, an arrangement may include more than two apertures. For example, a first aperture may be surrounded by at least two adjacent apertures. That is, the two adjacent apertures may be disposed on either side of the first aperture. Microenvironments below the adjacent apertures may have the same or different lower pressures than the microenvironment below the first aperture. In this way, the higher pressure regime in the microenvironment under the first aperture is at least partially surrounded by lower pressure regime microenvironments. The apertures may be disposed in a linear arrangement, such that they lie on a straight line drawn through the first aperture and the two adjacent apertures. Other arrangements may be used depending upon the specific deposition shape and arrangement desired, the ambient conditions, and other factors. In some embodiments, it may be preferred that any delivery aperture in an arrangement, i.e., any aperture that is used to eject material such as organic material toward a substrate, is positioned adjacent to an aperture that creates a lower-pressure microenvironment, such as an exhaust or other low-pressure-creating aperture.

In an embodiment, the first set of adjacent apertures including the two adjacent apertures having the same or different lower pressure under each adjacent aperture may be further surrounded by or otherwise adjacent to a second set of adjacent apertures located next to the first set of adjacent apertures. This second set of adjacent apertures may have microenvironments with the same or different higher pressure under each aperture, relative to the microenvironment under the first central aperture.

Figure 4:
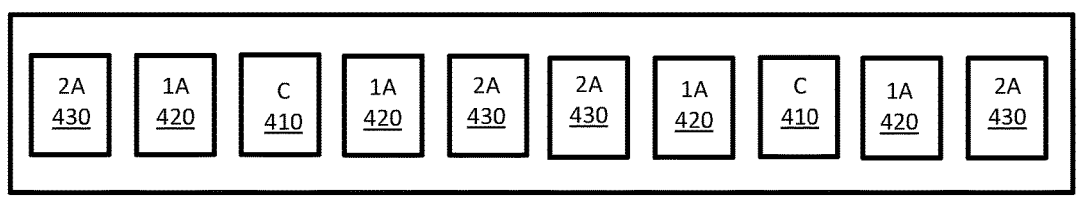
FIG. 4 shows an example schematic representation of an aperture arrangement according to an embodiment.

For example, in an embodiment, the first and second sets of adjacent apertures may be arranged in a linear arrangement with the first central aperture so that, when viewed from left to right on a deposition device, the apertures are arranged as follows: second adjacent aperture ("2A")—first adjacent aperture ("1A")—first, or "center" aperture ("C")—first adjacent aperture ("1A")—second adjacent aperture ("2A"). This arrangement may be repeated, for example in a continued linear arrangement or in the perpendicular direction so as to form a grid. In a specific linear embodiment, when viewed from left to right on a device, the apertures may be arranged as follows: 2A-1A-C-1A-2A-2A-1A-C-1A-2A. Alternatively or in addition, in some embodiments the outermost apertures and associated microenvironments may be "shared" among adjacent sets of apertures. For example, the repeated "2A" apertures may be replaced with a single aperture, which may have the same or different dimensions as singular "2A" apertures. For example, in a device that includes a repeated pattern of apertures, the outermost "2A" apertures may have different arrangements than inner apertures that have other apertures on either side. FIG. 4 shows a schematic view of such an embodiment as seen from below the device, e.g., viewed from a substrate over which the device is positioned. Each aperture shown in FIG. 4 may be associated with one or more vias and in fluid communication with other components as previously described, for example as shown in FIG. 3. As shown, one or more central apertures 410 may be adjacent to a first set of apertures 420, which have lower pressure microenvironments as previously described. Similarly, these apertures may then be further adjacent to a second set of apertures 430. The microenvironments below the second set of apertures may be at a higher pressure regime compared to the first set of aperture microenvironments and/or the central aperture microenvironment. Such a configuration may be desirable to create an inward flow toward each central aperture, thereby confining and shaping deposition of material ejected from the central apertures 410 toward a substrate as previously disclosed. It may be preferred for the outer high pressure apertures (i.e., the "2A" apertures) 430 to eject material that does not include the material that is to be deposited on the substrate. This prevents material that is to be deposited on the substrate from extending beyond the region on which deposition is desired on the substrate, and may further improve the effect of inward flow created by the arrangement described above.

FIGS. 3 and 4 show examples of linear arrangements of apertures. More generally, any pattern or order of apertures to one another may be used according to the present disclosure based on the intended result, such as the properties or arrangement of the deposited pattern of material deposited on the substrate. That is, the combination of high and low pressure microenvironments may be manipulated in order to obtain a desired deposition result. Aspects of the method or device that may be modulated, among other things, include the pressure under each aperture, the relative pressures between any two adjacent apertures, the flow rate of deposition, the flow rate of vacuum, the identity of the material to be deposited, the carrier medium for the material to be deposited, the identity of the substrate, the temperature of the substrate, the temperature of the material to be deposited, the spatial arrangement of the apertures, the size of an aperture.

As specific examples, the pressure in the microenvironments below each aperture as disclosed herein may be between 10 Torr and 1000 Torr, in the range of 50 Torr to 800 Torr, in the range of 50 Torr and 760 Torr, in the range of 50 Torr and 300 Torr, or any other suitable range. Generally, a lower pressure microenvironment does not need to be at any particular ratio or percentage of an associated higher pressure microenvironment pressure. In some embodiments, it may be desirable for a lower pressure microenvironment to have a pressure of about 75-99% the pressure of an associated higher pressure microenvironment.

The aperture arrangements disclosed herein may be used in various different deposition regimes and techniques. For example, a device for deposition by OVJP may use a nozzle block or other deposition apparatus having an aperture arrangement as described with respect to FIG. 3 or FIG. 4. As a specific example, in an embodiment an OVJP device includes apertures arranged as follows when viewed from left to right on the device: 2A (higher pressure)—1A (lower pressure)—C (higher pressure)—1A (lower pressure)—2A (higher pressure). Embodiments disclosed herein may be used to fabricate various devices, such as the OLEDs shown in FIGS. 1 and 2, and other similar devices. For example, arrangements disclosed herein may be used in OVJP and similar processes.

The apertures and associated vias disclosed herein may have any suitable physical configuration and may be fabricated and arranged within deposition devices using any suitable techniques. For example, the configurations, arrangements, and techniques disclosed in U.S. application Ser. No. 14/643,887, filed Mar. 10, 2015, Ser. No. 14/730,768, filed Jun. 4, 2015, and Ser. No. 15/290,101, filed Oct. 11, 2016, the disclosure of each of which is incorporated by reference in its entirety, may be used in conjunction with the arrangements disclosed herein.

In some embodiments, methods of using the arrangements disclosed herein may include providing a higher pressure under a central ("C") aperture, providing a lower pressure microenvironment under first adjacent apertures, and/or providing a higher pressure microenvironment under second adjacent apertures located adjacent to the first adjacent apertures as previously disclosed. More generally, the microenvironment under an aperture, and especially the relative pressure of a microenvironment, can be controlled or modulated. The pressure of each microenvironment under each aperture in a device can be separately and independently modulated, and/or one or more microenvironments may be co-modulated or otherwise linked, such as by providing the same conditions, placing the microenvironments into fluid communication with common pressure sources, or the like.

In an embodiment, deposition of materials according to the methods and/or devices herein is used to prepare organic opto-electronic devices, such as organic light emitting diodes (OLEDs), organic phototransistors, organic photovoltaic cells, and organic photodetectors.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A deposition device for depositing a material onto a substrate, comprising:
   a delivery device comprising a first aperture in fluid communication with a delivery gas and a source of organic material to be deposited on a substrate, the first aperture configured to create a higher pressure regime in a first microenvironment below the first aperture; and
   a second aperture, disposed adjacent to the first aperture, and configured to create a lower pressure regime in a second microenvironment below the second aperture;
   wherein the delivery device creates a higher pressure regime in a third microenvironment adjacent to the second aperture.

2. The device of claim 1, further comprising:
   a vacuum source in fluid communication with the second aperture.

3. The device of claim 1, further comprising:
   a third aperture disposed adjacent to the second aperture, the third aperture configured to create a higher pressure regime in a third microenvironment below the third aperture.

4. The device of claim 3, further comprising:
   a fourth aperture disposed adjacent to the first aperture and approximately in a line with the second aperture, the fourth aperture configured to create a lower pressure regime in a fourth microenvironment below the fourth aperture.

5. The device of claim 4, further comprising:
   a fifth aperture disposed adjacent to the fourth aperture, the fifth aperture configured to create a higher pressure regime in a fifth microenvironment below the fifth aperture.

6. A device for deposition of at least one material on a substrate, the device comprising:
   a first aperture;
   a second aperture adjacent to the first aperture;
   a source of material to be deposited on a substrate, the source of material being disposed fluid communication with the first aperture;
   wherein, when the device is in operation, a higher pressure regime exists in a first microenvironment below the first aperture, a lower pressure regime exists in a second microenvironment below the second aperture, and a higher pressure regime exists in a third microenvironment adjacent to the second microenvironment.

7. The device of claim 6, wherein a delivery gas source is in fluid communication with the source of material to be deposited with the first aperture.

8. The device of claim 6, further comprising:
   a delivery gas source in fluid communication with the source of material to be deposited with the first aperture.

9. The device of claim 6, further comprising:
   a third aperture adjacent to the second aperture, wherein, when the device is in operation, the pressure of the third microenvironment is set via the third aperture.

* * * * *